United States Patent

Levine

[11] 3,958,210
[45] May 18, 1976

[54] CHARGE COUPLED DEVICE SYSTEMS

[75] Inventor: Peter Alan Levine, Kendall Park, N.J.

[73] Assignee: RCA Corporation, New York, N.Y.

[22] Filed: Feb. 5, 1975

[21] Appl. No.: 547,129

[52] U.S. Cl. .............................. 340/173 R; 357/24; 307/304
[51] Int. Cl.$^2$ .................. G11B 11/08; H01L 29/78; H03K 3/353
[58] Field of Search ........ 340/173 R, 347 A–347 D, 340/173 LS; 357/24; 307/221 D, 304

[56] References Cited
UNITED STATES PATENTS

| | | | |
|---|---|---|---|
| 3,771,149 | 11/1973 | Collins | 340/173 LS |
| 3,819,958 | 6/1974 | Gosney | 307/304 |
| 3,858,232 | 12/1974 | Boyle | 357/24 |
| 3,903,543 | 9/1975 | Smith | 357/24 |

OTHER PUBLICATIONS

T. D. Mok & C. A. T. Salama – "Charge–Transfer–Device Logic Cell" Solid–State Electronics, 1974, Vol. 17, pp. 1147–1154, Pergamon Press, Gt. Britin.

*Primary Examiner*—Daryl W. Cook
*Assistant Examiner*—Robert M. Kilgore
*Attorney, Agent, or Firm*—H. Christoffersen; Samuel Cohen

[57] ABSTRACT

Analog signals initially are stored in an a linear array such as a charge coupled device (CCD) register. There is provided, for each stage of the linear array, a different column of a CCD matrix, termed here a B register. During a transfer interval, the analog charge signals concurrently are permitted to flow into the columns. As the stages in the B register have much smaller charge storage capacity than the stages in the linear array, the charge signal fills and then overflows successive potential wells of each column until an equilibiium condition is reached. At equilibrium, the number of filled wells in a column will be proportional to the amplitude of the charge signal supplied to that column by the stage of the linear array coupled to the column. The matrix is read by concurrently sensing all of the signals present in one column, and then doing the same for each following column.

8 Claims, 6 Drawing Figures

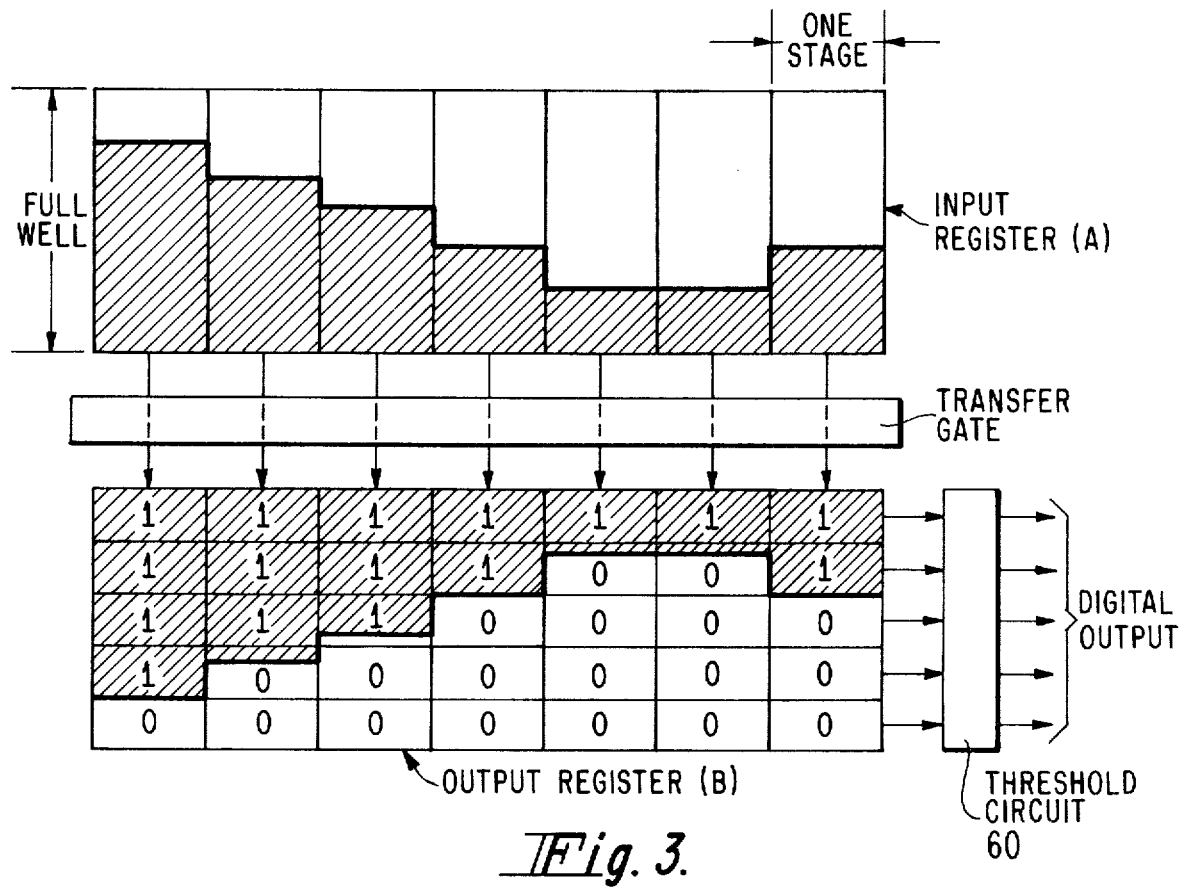
_Fig. 3._
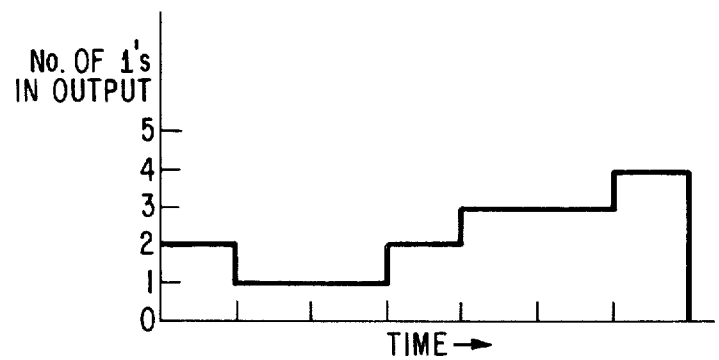
_Fig. 4._

CHARGE COUPLED DEVICE SYSTEMS

This application deals generally with analog to digital conversion.

In a preferred form of the invention, analog signals initially are present in a first array. The respective stages of the array are coupled to columns of a second array, a charge coupled device (CCD) matrix, known as a B register. During a transfer interval, the analog signals concurrently are flowed into the columns and, as the stages in the CCD matrix have much smaller charge storage capacity than the stages in the first array, from 0 to $n$ stages of any particular column may become filled depending upon the amplitude of the analog signal for that column. The matrix may be read by concurrently sensing all of the signals present in one column and then doing the same for the following columns.

In the drawing:

FIG. 3 is a schematic showing of the charge present in the A and B registers during different periods of time;

FIG. 4 is a graph to further help explain the operation of the system of FIG. 1;

Figure 1:
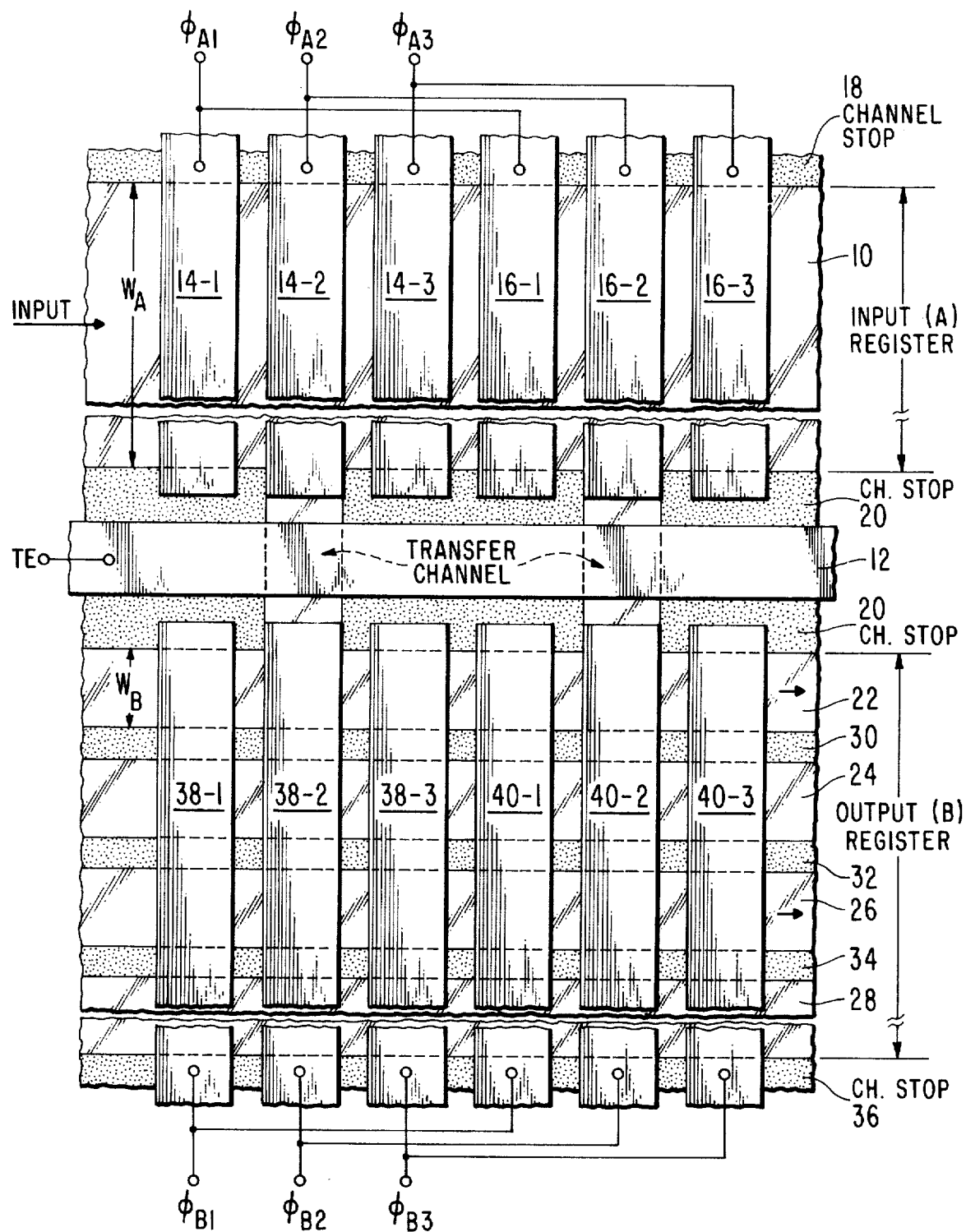
FIG. 1 is a plan view of a portion of a system embodying the invention.

The system of FIG. 1 includes a semiconductor substrate 10, an A register formed on one portion of the substrate, a CCD matrix of columns and rows, termed a B register, formed on a second portion of the substrate, and a transfer gate 12 between the two registers. The A register comprises an input means (not shown) which may comprise a region in the substrate of opposite conductivity to the substrate which acts as a source of charge carriers. The register also may include an input gate (not shown) to which an analog signal may be applied for transferring charge in serial fashion from the source electrode to the first storage electrode. (Alternatively, a form of A register could be employed which received input signals, in parallel). The A register also includes a plurality of storage electrodes operated by three phase voltages $\phi_{A1}$, $\phi_{A2}$ and $\phi_{A3}$. Two sets of such electrodes 14-1, 14-2, 14-3 and 16-1, 16-2 and 16-3 are illustrated. Each set of electrodes comprises a storage location. These electrodes are spaced from the substrate by a thin layer of insulation, such as one formed of silicon dioxide. The electrodes may be spaced very close to one another or may overlap one another at their edges. All of these elements make up a CCD register which in itself is well known.

The boundaries of the A register comprise channel stops 18 and 20. Channel stop 18 is continuous whereas channel stop 20 is present at the edges of the $\phi_{A1}$ and $\phi_{A3}$ electrodes but is not present in the regions adjacent to the $\phi_{A2}$ electrodes such as 14-2 and 16-2. As is well understood in the art, the channel stops may comprise regions of the substrate which are highly doped and which are of the same conductivity as the substrate. They confine charge present in a register channel to the channel.

The B register has column and rows of CCD storage locations, and each row can be considered a digital register. The structure of the B register includes a plurality of channels, four of which are shown at 22, 24, 26 and 28, forming the rows of a matrix. The channels are separated from one another by regions maintained at surface potentials which form "spillover barriers" discussed shortly. Such barriers may be obtained, for example, by placing diffused regions 30, 32 and 34 in the substrate. Each such region is of the same conductivity as the substrate but is not as highly doped as a channel stop region. Thus, the spillover potential barriers provided by regions such as 30, 32 and so on are not as high as the barrier provided by a channel stop. The doping level is also such that the spillover barriers are lower than the potential barriers along the length of the channels beneath the gate electrodes and which separate the potential wells along the channels from one another. These characteristics will be discussed at greater length later in connection with the operation of the system. The last of the registers is bounded on one edge by a channel stop 36.

The B register includes also a plurality of electrodes, two sets of which, 38-1, 38-2, 38-3 and 40-1, 40-2, 40-3, are illustrated. These electrodes align with corresponding electrodes of the A register and are operated by the three phase voltages $\phi_{B1}$, $\phi_{B2}$ and $\phi_{B3}$. Charge stored beneath the phase two electrodes 14-2 and 16-2 of the A register can be coupled to the phase two electrodes 38-2 and 40-2, respectively of the B register by applying an appropriate voltage TE to the transfer gate electrode 12, as will be discussed shortly.

In the discussion which follows of the operation of FIG. 1, FIGS. 1-4 should all be referred to. It may be assumed to start with that charge signals representing analog information have been shifted into the A register and that the $\phi_A$ voltages are such that the charge at each stage is stored only beneath the $\phi_{A2}$ electrodes 14-2 and 16-2. The remaining electrodes 14-1, 14-3, 16-1 and 16-3 are maintained at potentials such that potential barriers are present beneath these electrodes. It may be observed that the electrodes of the A register are of substantial area - many times that of the area of a B register electrode over a particular channel. In other words, an electrode such as 14-2 may have an area in the region of the electrode over the A channel which is 10 times that of the area of electrode 38-2 over channel 22. Put another way, if the channel of the A register has a width $W_A$ and the width of a channel of the B register is $W_B$, then $W_A$ may be 10 times greater than $W_B$, assuming electrodes 14-2 and 38-2 are of the same width. What this means, in effect, is that each stage of input register A has a much larger charge storage capacity then the corresponding stage of one channel of the B register, assuming the same voltage is applied to the electrodes of these stages. It should be mentioned, in passing, that the 10 to 1 ratio given is not critical, the number chosen being a matter of design. With a 10 to 1 ratio, the charge present at one stage of the A register, when the well of that stage is full, is capable of filling the wells at a corresponding location in 10 channels of the B register (making the assumption that at least 10 different channels are present in the B register).

Figure 2:
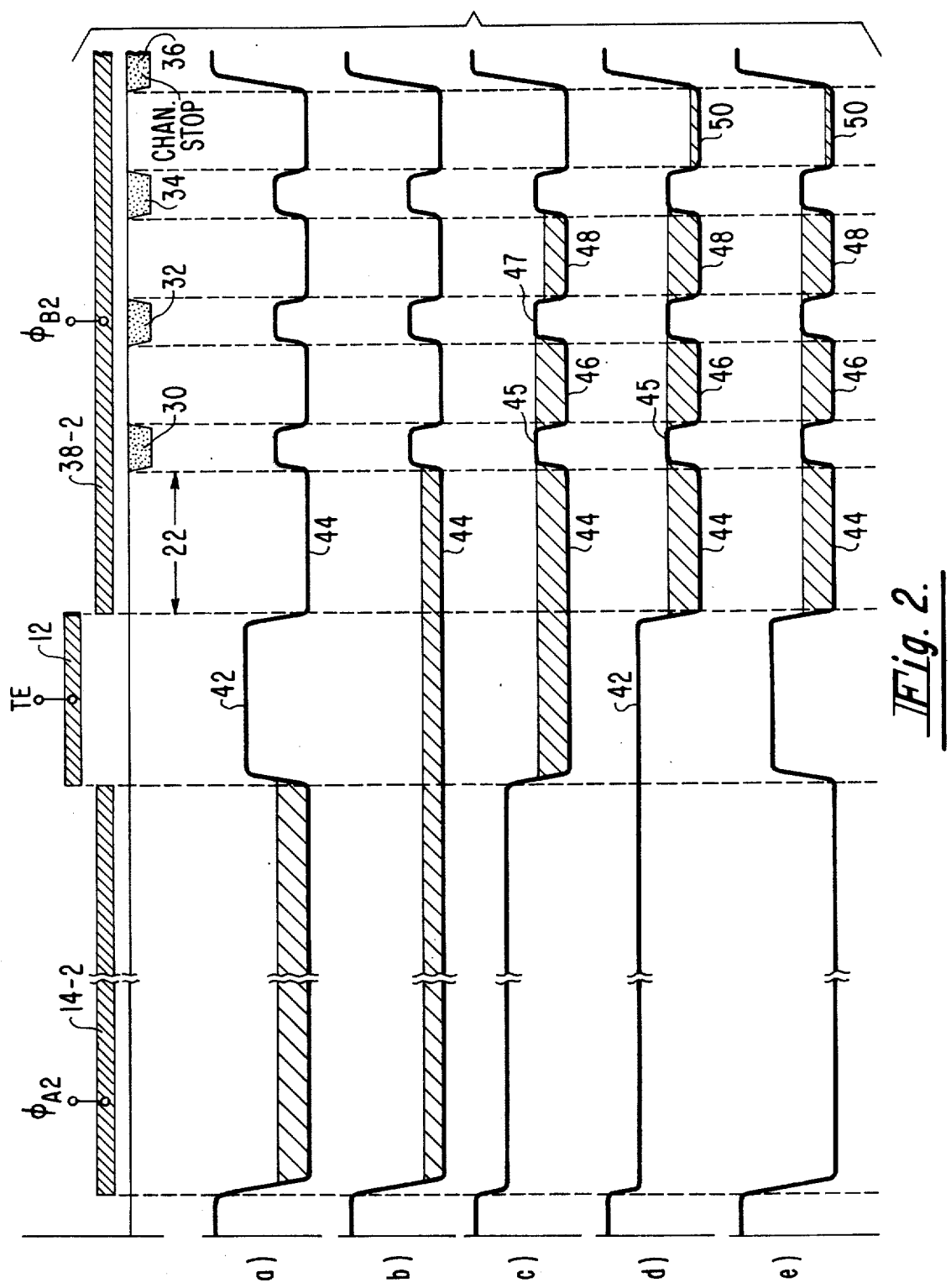
FIG. 2 is a drawing of surface potential profiles to help explain the operation of the system of FIG. 1.

Returning to the operation, after the analog signals are stored in the A register, the surface potential profile may be as shown at $a$ in FIG. 2. The potential well beneath the electrode 14-2, shown by way of example, is filled with an amount of charge proportional to an analog signal. The transfer electrode 12 is at a potential such that a barrier is present (shown at 42) in the transfer channel. The potential wells beneath electrode 38-2 are all empty. The diffused regions 30, 32 and 34 cause relatively low potential barriers to be present between these potential wells. The channel stop 36 causes a relatively high potential barrier to be present at one edge of the B register. The phase 1 and phase 3 electrodes 38-1, 40-1 and 38-3, 40-3 are at potentials to form potential barriers beneath these electrodes, which are higher than those provided by the regions 30, 32, 34.

A transfer pulse is now applied to the transfer gate electrode 12. The result is illustrated at $b$ in FIG. 2. In response to the pulse, the potential barrier 42 is removed and a conduction channel is substituted therefor. A portion of the charge present beneath electrode 14-2 passes through this conduction channel and partially fills the first potential well 44. This well is the one present in channel 22 of FIG. 1. This charge is prevented from spreading down channel 22 (the direction into the paper in FIG. 2) by the potential barriers beneath the $\phi_{B1}$ and $\phi_{B3}$ electrodes of the B register.

Next the $\phi_{42}$ potential is changed in a sense to reduce the depth of the potential well beneath electrode 14-2 while the TE pulse is still present. The result is shown at $c$ in FIG. 2. The first well 44 has overflowed and charge has passed over spillover barrier 45 to the second well 46. Then the second well fills and overflows the barrier 47 to the third well 48. In the final condition shown at $c$, all of the charge formerly present beneath electrode 14-2 has passed to regions of the substrate which include the transfer channel and the potential wells 44, 46 and 48. In the present example, potential well 44 is filled to the top. The adjacent potential well 46 is filled to the top and the next potential well 48 is almost completely filled. The charge preferentially flows from channel-to-channel over the spillover potential barriers provided by structures 30, 32, 34, rather than down a particular channel because the potential barriers beneath the $\phi_{B1}$ and $\phi_{B3}$ electrodes are higher than the spillover potential barriers.

The final step in the transfer process is shown at $d$ at FIG. 2. This is to return the transfer gate electrode 12 potential to its original value to again provide a potential barrier 42 as shown. This causes any charge remaining present beneath the transfer electrode to propagate into the potential wells beneath electrode 38-2. The result, illustrated in FIG. 2 at $d$, is that potential well 48, which was only partially filled previously, now fills to the top and a slight amount of charge overflows to potential well 50. The electrode 14-2 may now be returned to its original voltage level as illustrated at $e$ in FIG. 2.

Summarizing what is depicted in FIG. 2, the charge initially present in a stage of the A register has caused a plurality of potential wells in the B register to become filled. The number of such wells which become filled will depend upon the amplitude of the charge signal in the A register stage. In the present example, three wells 44, 46 and 48 have become completely filled and a small amount of charge has passed into the well 50. The filled wells can be assumed to represent binary 1. Any well filled less than half full can be assumed to represent binary 0. Accordingly, in the example given by way of illustration, the analog signal present in a particular stage of the A register has been translated to three 1's.

After the transfer procedure described above, the $\phi_B$ multiple phase voltages, which can be at the same or at a different frequency than the $\phi_A$ voltages, transfer the digital or quantized information present in the B register to an output circuit. The transfer is in the channel direction as indicated in FIGS. 1 and 3. During this transfer process, the spillover barriers operate as channel stops to prevent the charge propagating down one channel from passing into an adjacent channel.

In the operation of the system of FIG. 1, the slowest transfer process is that from the A to the B register. The reason is relatively long path length (the length of a phase 2 electrode in the A register, plus the length of a phase 2 electrode in the B register) over which the charge signal must propagate. This transfer time is much longer than the time required for the multiple phase voltages to move charge signals from one stage to the next down the channel. However, since the transfer of charge from the A to B registers takes place in parallel, that is, the entire contents of the A register flows into the B register, and since the A register can have many many stages (100, 500 and more, all being reasonable) the analog to digital conversion still takes place at reasonably high speed.

FIG. 3 illustrates schematically the conversion of analog information in the A register to quantized information in the B register. This information subsequently is propagated, column by column, to the output of the B register, by the $\phi_B$ multiple phase voltages. There, each column of signals may be applied to a threshold circuit 60. The latter may be set to produce an output signal representing a 1 when the charge is greater than a given value — say half a well, and to produce an output signal representing a 0 when the charge is smaller than this value. Thus, each multiple bit output signal produced is a digital or quantized equivalent of an analog signal present in a particular stage of the A register.

The multiple bit signals produced by stage 60 may be applied to logic stages for translating the digital indication to a binary number or a binary coded decimal (BCD) number. Such binary or BCD number can be stored in, and later processed by, a digital computer. Alternatively, the individual signals in a group of such signals may be added to one another to substantially reproduce the analog signal from which the digital signal initially was derived.

FIG. 4 is simply a graph to illustrate the outputs produced by threshold circuit 60 as a function of time for the specific example illustrated in FIG. 3.

Figure 5:
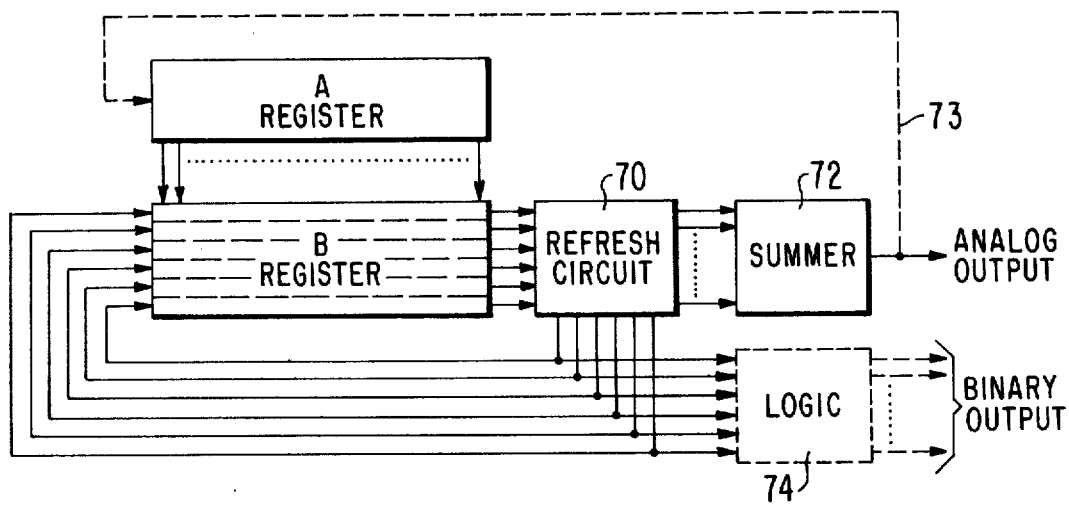
FIG. 5 is a block diagram of a memory emobodying the invention.

FIG. 5 illustrates how the system of the present invention may be employed as a memory. (The transfer gate 12, while not illustrated specifically, is assumed to be present.) The A and B registers are similar to those already illustrated and discussed. The output of the B register is applied to a refresh circuit 70 which regenerates the signals it receives and applies them back to the input circuit of the B register. (A threshold circuit is included in stage 70 for eliminating charge signals which occupy less than one half well.) Thus, once the initial transfer from the A to the B register is completed, the information in the B register may be stored (circulated) for as long as desired. During readout, a summer 72 may be employed to add the individual signals in each group and to thereby reproduce the analog signals initially present in the A register. Alternatively, logic circuits 74, shown in dashed line, may be employed to translate the digital signals to binary or BCD signals.

An important attribute of the memory of FIG. 5 is that because of the digital nature of the signals, transfer losses have substantially no effect on the system operation. Were the A register analog signal simply recirculated, there would be such losses. Each time a signal travelled around the loop from its initial location to the output terminal of the A register back to the input terminal then back to its initial location it would suffer some loss, dependent upon the number of charge transfers and the charge transfer efficiency. While such loss may be very small for a single recirculation, it becomes larger each additional recirculation and where hundreds or thousands of trips around the loop are involved, the analog signal soon may be destroyed. In the system of FIG. 5, however, the refresh circuit decides, each time it receives a signal, whether a 1 or 0 is present, and produces a feedback signal at a predetermined level representing that binary digit. Thus, even if a 1 charge level deteriorates almost 50% during one traversal of the loop, each time it reaches the refresh circuit it is returned to the 100% level.

If there are a large number of channels in the B register, there will be a correspondingly large number of feedback leads needed in the system of FIG. 5. In some circumstances, this may be undesirable. Such feedback leads may be dispensed with and a single lead 73, shown in phantom, substituted therefor in an alternative form of the system. Now rather than feedback from the refresh circuit 70 to the B register, the output of the summer (an analog signal but quantized at one of $n$ different levels, where $n$ is the number of channels) is fed back to the A register. The operation, in other respects, is believed to be self-evident from the explanation already given. The price paid for the reduction in the number of feedback leads is that the recirculation frequency will be limited by the transfer speed from the A to the B register.

Figure 6:
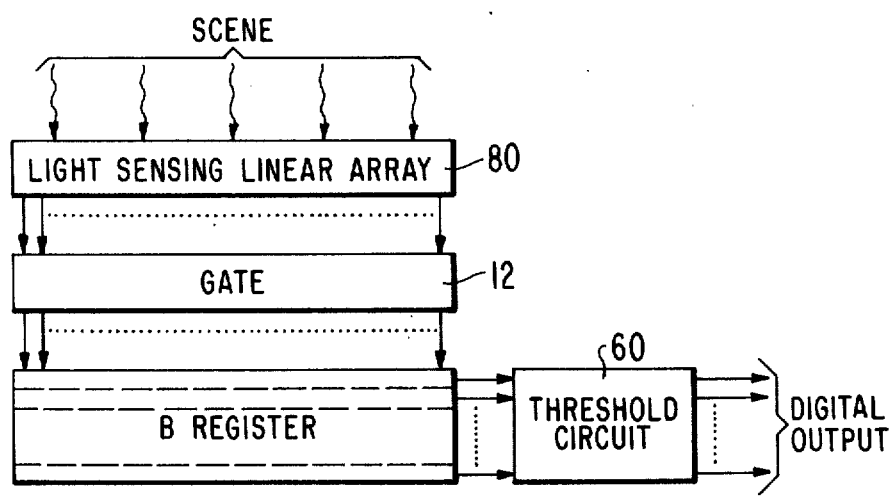
FIG. 6 is a block diagram of an imager system embodying the invention.

The arrangement of FIG. 6 shows how radiation may be translated to digital signals. The array 80 preferably is a linear array such as a linear CCD imager, or a linear array of photodiodes, or a linear array of any other kind which has the ability to translate a radiation signal to a charge signal, and which either is self-resetting or which can be reset to a reference level after each transfer of charge signal through gate 12. One "line" of the scene being viewed may be projected onto the linear array to produce a stored analog charge pattern corresponding to the received illumination. That charge pattern may be translated into digital information stored in the B register in the manner already discussed and that information shifted out of the B register via the threshold circuit to an output circuit. The output circuit may be any one of the types already discussed. The same process may be repeated for successive lines of the scene by producing relative movement between the linear array 80 and the scene, in a manner which in itself is known. For example, the scene being viewed may be a photo on a drum and the drum rotated relative to the linear array about an axis parallel to the linear array. Alternatively, the linear array may be moved physically relative to the scene being viewed in a direction at right angles to the long dimension of the array.

Resolution is substantially unaffected in the system of FIG. 6, by transfer losses. Each analog charge level is translated immediately to a number of 1's. The threshold circuit refreshes the signal so that the digital output is a very accurate representation of the analog signal. Even if a signal suffered an amplitude loss of almost 50% during its propagation along the length of the B register to the output of the B register, the threshold circuit still would be able to distinguish 1's from 0's. Resolution in the system of FIG. 6 is a function of the number of channels in the B register. Were the analog signal itself shifted through a large number of CCD stages, it could suffer transfer losses in an amount depending upon the transfer efficiency, stage-to-stage, and the number of stages. Such losses involve leaving a small amount of charge signal behind, during each transfer of the charge from one CCD stage to the next, and this causes smearing (loss of resolution) in the read-out signal pattern.

While the invention has been illustrated in terms of a three phase system, it is to be understood that the inventive teachings are equally applicable to 1, 2, 4 or higher phase CCD's. It is also to be understood that either P channel (that is, N type substrate) or N channel (P type substrate) CCD's may be employed, provided appropriate operating voltages are employed. It is also to be understood that the system can employ either "surface channel" or so called "buried channel" CCD's. For buried channel operation, rather than using diffusions to creat the spillover barriers, gate electrodes insulated from the substrate, lying beneath the electrodes 38 and 40, and extending in the row direction, would be employed. By placing such gate electrodes at an appropriate potential, spillover barriers of the desired height may be obtained.

The electrode structure of FIG. 1 comprises so-called single layer construction and the electrodes may be formed of aluminum or polysilicon, as examples. It is to be understood that this is intended to be illustrative only. Alternative forms of construction using two or three layer construction, with overlapping gate electrodes may be employed instead.

While in the embodiment of FIG. 6 a linear radiation sensing array 80 is shown, it is to be appreciated that other forms of arrays such as those having a number of columns and rows, or even spiral arrays may be employed instead. However, here the interconnection problem from each location in array 80 to a different column in the B register, for effecting the parallel transfer of the entire contents of the array to the B register, becomes more difficult. It is also to be appreciated that in cases where array 80 consists of a single row of elements, that row can be one row of a large array of sensing elements. For example, in the case of a CCD imager of the frame transfer type, which includes an imaging area known as an A register, a storage area known as a B register, and an output register known as a C register, the last row of the storage area may be substituted for linear array 80 of FIG. 6. The B register of the present FIG. 6 will then serve as the output register (the C register) of the frame transfer system.

What is claimed is:

1. In combination:
    an input linear array having a plurality of stages, each capable of storing a given amount of charge, each stage for storing an analog charge signal;
    a plurality $n$ of conversion charge coupled device registers, each conversion register having a plurality of at least $m$ stages and each stage having only a fraction of the storage capacity of a stage of said input linear array, where $n$ and $m$ are integers greater than 1;

means for flowing the charge signal in each $j$'th stage of said input linear array into from 0 to $n$ of the $j$'th stages of said conversion registers, the number depending on the amplitude of the charge signal present in the $j$'th stage of the input linear array, where $j$ is an integer equal to 1, 2 - - - $m$, $m$ being not greater than the total number of stages in the input linear array;

means for concurrently shifting the charge signals in said $n$ conversion registers down said registers; and means for reading, in parallel, each group of charge signals reaching the output stage of said $n$ conversion registers.

2. In the combination as set forth in claim 1, said conversion registers being integrated onto a common semiconductor substrate and each register being separated from the next adjacent register by means providing a potential barrier in the substrate which is sufficiently low to permit charge signal to pass from a stage in one register to a corresponding stage in the next register during the flowing of charge from said input linear array to said conversion registers, and which is sufficiently high to isolate the charge in one register from that in the next adjacent register, during the propagation of charge down said conversion registers.

3. In the combination as set forth in claim 2, said linear array comprising a charge-coupled register.

4. In the combination as set forth in claim 2, said linear array comprising a radiation sensing array.

5. In the combination as set forth in claim 2, said means providing a potential barrier comprising a diffusion in said substrate of the same conductivity as the substrate but more highly doped than the substrate.

6. In the combination as set forth in claim 1, each conversion register including an output stage at one end of the register and an input stage at the other end of the register, and further including n feedback connections, each connecting an output stage of a conversion register back to its input stage.

7. In combination:

a charge coupled device array comprising a substrate, a plurality of channels in the substrate extending in the row direction, and electrodes to which transfer voltages may be applied, insulated from the substrate and extending in the column direction;

means for transferring charge signals into said array comprising means for flowing said signals into the array in the column direction for passage from channel-to-channel along the columns; and means for reading charge signals out of said array comprising means for applying transfer voltages to said electrodes for shifting said charge signals in the row direction along said rows.

8. In the combination as set forth in claim 7, said means for transferring charge signals into said array comprising a radiation sensing array, and charge transfer means for transferring the charge signals accumulated in said radiation sensing array into said charge coupled device array.

* * * * *